(12) United States Patent
Amit et al.

(10) Patent No.: US 7,318,212 B2
(45) Date of Patent: Jan. 8, 2008

(54) METHOD AND SYSTEM FOR MODELING WIRING ROUTING IN A CIRCUIT DESIGN

(75) Inventors: Niv Amit, Givat Shmuel (IL); Ronit Bustin, Ra'anana (IL); Lidor Goren, Netanya (IL); Omer Heymann, Tel Aviv-Jaffa (IL); Moshe Leibowitz, Haifa (IL); Gil Noy, Ramat Gan (IL); Alex Raphayevich, Kiryat Ekron (IL); Maya Speiser, Tel Aviv-Jaffa (IL)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 11/232,747

(22) Filed: Sep. 22, 2005

(65) Prior Publication Data

US 2007/0067750 A1    Mar. 22, 2007

(51) Int. Cl.
*G06F 17/50* (2006.01)
(52) U.S. Cl. .............................. 716/12; 716/2; 716/11
(58) Field of Classification Search ................. 716/2, 716/11, 12
See application file for complete search history.

(56) References Cited

U.S. PATENT DOCUMENTS

| | | | |
|---|---|---|---|
| 4,698,760 A | 10/1987 | Lembach et al. | |
| 4,924,430 A | 5/1990 | Zasio et al. | |
| 5,274,568 A | 12/1993 | Blinne et al. | |
| 5,572,437 A | 11/1996 | Rostoker et al. | |
| 5,617,325 A | 4/1997 | Schaefer | |
| 5,841,672 A | 11/1998 | Spyrou et al. | |
| 5,875,114 A | 2/1999 | Kagatani et al. | |
| 6,080,201 A | 6/2000 | Hojat et al. | |
| 6,189,131 B1 | 2/2001 | Graef et al. | |
| 6,317,861 B1 | 11/2001 | Hasegawa | |
| 6,463,567 B1 | 10/2002 | Kozai | |
| 6,532,577 B1 | 3/2003 | Mbouombouo et al. | |
| 6,581,195 B2 | 6/2003 | Tanaka | |
| 6,665,845 B1 * | 12/2003 | Aingaran et al. ............... | 716/5 |

(Continued)

OTHER PUBLICATIONS

Burstein et al., "Timing-influenced layout design", IBM Technical Disclosure Bulletin, vol. 28, No. 11, Apr. 1986.
Luitjen, "Time-driven CMOS gate placement", IBM Technical Disclosure Bulletin, vol. 33, No. 1A, Jun. 1990.

*Primary Examiner*—Thuan Do
(74) *Attorney, Agent, or Firm*—Suzanne Erez

(57) ABSTRACT

The present invention is a method and system for modeling wiring routing in circuit design. According to some embodiments, the wire model objects ("WMO") may be inserted into the wiring routing on a 'WMO-per-segment' basis. According to some other embodiments, the wire model objects may be inserted into the wiring routing per groups of sequential segments. The entire wiring routing geometry may constitutes one group, and a wire model object may be inserted between the source point(s) and the target points based on the longest path in the routing geometry. An insertion rule may be selected based on any combination of the following factors: segment length, total path length, spacing between adjacent segments, wire metal and wire width. A wire model object may be selected from a group consisting of: {"C"; one "RC" arrangement; 'n' times "Π"-type filter arrangement, wherein n=1, 2, 3, . . . , }. Several length ranges may be predefined to associate each segment, or path, with a particular type of wire model object.

6 Claims, 4 Drawing Sheets

U.S. PATENT DOCUMENTS

| | | |
|---|---|---|
| 6,880,141 B1 | 4/2005 | Tetelbaum |
| 2002/0056070 A1 | 5/2002 | Tanaka |
| 2003/0169059 A1* | 9/2003 | Bodenstab .................. 324/713 |
| 2004/0111688 A1 | 6/2004 | Lee et al. |
| 2004/0216062 A1 | 10/2004 | Fan |

* cited by examiner

METHOD AND SYSTEM FOR MODELING WIRING ROUTING IN A CIRCUIT DESIGN

FIELD OF THE INVENTION

The present invention relates generally to the field of integrated circuit ("IC") design and the interconnection wiring used between elements, or components, (e.g transistors, capacitors, etc.) of an IC. More specifically, the present invention relates to a method and system for substantially automatically modeling a wiring routing geometry with respect to signals' propagation delays associated with various circuit designs including full custom circuit designs.

BACKGROUND

Electrical circuits consist of a variety of components, for example, resistors, capacitors, inductors, diodes and transistors. When designing an electrical circuit, the circuit is expected to satisfy certain user-specified requirements. The creation of a complex circuit typically involves creation of a topology, component sizing and placement, and also routing of wires that interconnect the circuit's components.

By 'placement' is meant assignment of each of the circuit's components to a particular physical location on, e.g., a printed circuit board or a silicon wafer. By 'routing' is meant assignment of a particular physical location to wires interconnecting the leads of the circuit's components.

The physical location of the components and wires may affect the overall behavior of the circuit to some extent because electrical components and wires may have interactions with one another based on their physical dimensions and location. These interactions, generally called parasitic effects, are generally small and may not be important to the performance of relatively 'simple' circuits operating at relatively low frequencies. In such cases, parasitic effects may simply be factored out. By 'parasitic effect' is meant undesired effect caused by capacitance, resistance, and sometimes inductance, which are introduced by wires that interconnect devices in a circuit.

Parasitic effects may detrimentally affect the performance of a more complex circuit or a circuit operating at relatively high frequencies, for example, at radio frequencies ("RF") or higher frequencies. Under such circumstances, it may be impossible to design a practical circuit without factoring in parasitic effects.

Electric wires are known for introducing an overall intrinsic parasitic capacitance that is a function of a capacitance-per-unit length value (e.g., 15 pF/meter). Therefore, the longer the wire, the greater is its intrinsic parasitic capacitance, and the more detrimental effect it would likely to have on the performance of the full custom circuit involved.

For the reasons described hereinbefore, delay models (or, equivalently, wire model objects) that are useful for timing analysis simulations, are required in order to evaluate the temporal functionality of the designed circuit at high operating frequencies. A 'wire model object' ("WMO") typically consists of resistor and capacitor elements arranged in a way to reflect as closely as possible parasitic effects associated with a specific wire, or a signal path. A WMO is inserted into (i.e., to replace wires in) the circuit in the schematic sense, between corresponding circuit elements or devices and instead of the wire it replaces.

WMOs are widely used in the design process of circuits, as they are a major tool for evaluating time performance of the circuits before they are actually laid out and fabricated. More specifically, after setting the placement of the circuit elements and wiring routing, WMOs are schematically inserted into several locations in the circuit schematics to replace wire segments, or sections, that are suspected as problematic (in terms of time performance). Then, time simulations are typically performed on the circuit schematics to evaluate parasitic effects that might be induced by real wires; that is, assuming the wires are routed according to the estimated wiring routing. The results of the time analysis will determine whether components will have to be resized and re-placed. If the time analysis is favorable, the circuit may be fully laid out and prepared for fabrication. Otherwise, the problematic circuit portions may have to be reformulated.

The type (i.e., the individual elements and their arrangement) of a WMO is generally determined by several parameters, such as, but not limited to, the length, width type of metal of the planned wire.

However, wire model objects are traditionally calculated and inserted into circuit schematics manually, which is troublesome, as explained hereinafter. Therefore, wire models can be used only in respect of a relatively small number of wires, which is problematic because even relatively simple circuits include large number of interconnection, and other type of wires. For this reason, in the traditional wires modeling, a circuit designer has first to intuitively identify wires as 'critical wires' and, then construct, or calculate, wire models only in respect of the 'critical wires'. Therefore, using wire model objects in the traditional manner is far from being satisfactory for circuits consisting of thousands, and even hundreds, of devices (e.g., logical gates). Put simply, it is impractical to manually construct delay models for a large number of wires. By intuitively determining critical wires, a circuit designer may erroneously think of non-critical wires as critical ones. On the other hand, the circuit designer may inadvertently overlook 'real' critical wires. For the reasons described hereinbefore, when a circuit's schematic is designed, only an incomplete 'picture' of the overall potential parasitic effects is factored in when performing the timing analysis.

Therefore, a need exists for automated modeling procedure in respect of interconnection, and other types of, wires.

Another need exists to provide a method for fast, reliable and convenient modeling of interconnection, and other types of, wires in a circuit's schematic.

A further need exists to provide a method for allowing modeling some or all the wires associated with a circuit's schematic design.

SUMMARY OF THE INVENTION

According to some embodiments of the present invention, there is provided a method for modeling an interconnection wiring routing having a known geometry by defining a wire model strategy and automatically replacing said geometry with one or more wire model objects based on said wire model strategy. According to some embodiments of the present invention, a method and a system is provided which may at least partially automate the modeling procedure with respect to interconnection, and other types of wires. The method may provide for modeling of interconnection, and other types of, wires in a circuit design, and it may also allow for modeling of some or all the wires in a circuit design.

By using the physical geometry of the wiring routing of a signal path and predefining a 'wire model strategy', the wiring routing may be modeled in whole or in part. The wiring routing may be modeled by replacing, in the schematic sense, one segment, or a group of sequential segments, with one or more wire model object(s) ("WMOs"), or replacing the entire wire routing geometry with one WMO, based on the predefined wire model strategy.

According to further embodiments of the present invention, a system for modeling wiring routing in a circuit having a known geometry may include an input memory for storing therein, inter alia, data relating to a physical geometry of wiring routing of a signal path in an electric circuit. The geometry may be defined by a cluster of wires having one or more source and target points, and by line segments that may interconnect with these points. The system may include a model decision maker ("MDM") module for deciding which of one or more WMO's should be used to replace and/or model a wire segment. The MDM may include a decision element, a storage array for storing therein WMO's and a set of selection rules that depends on a preferred wire model strategy.

According to the present invention, a computer program product is also provided, which comprises a computer useable medium that includes a computer readable program. The computer readable program, when executed on a computer, may cause the computer to model an interconnection wiring routing having a known geometry by defining a wire model strategy and automatically replacing said geometry with one or more wire model objects based on said wire model strategy.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
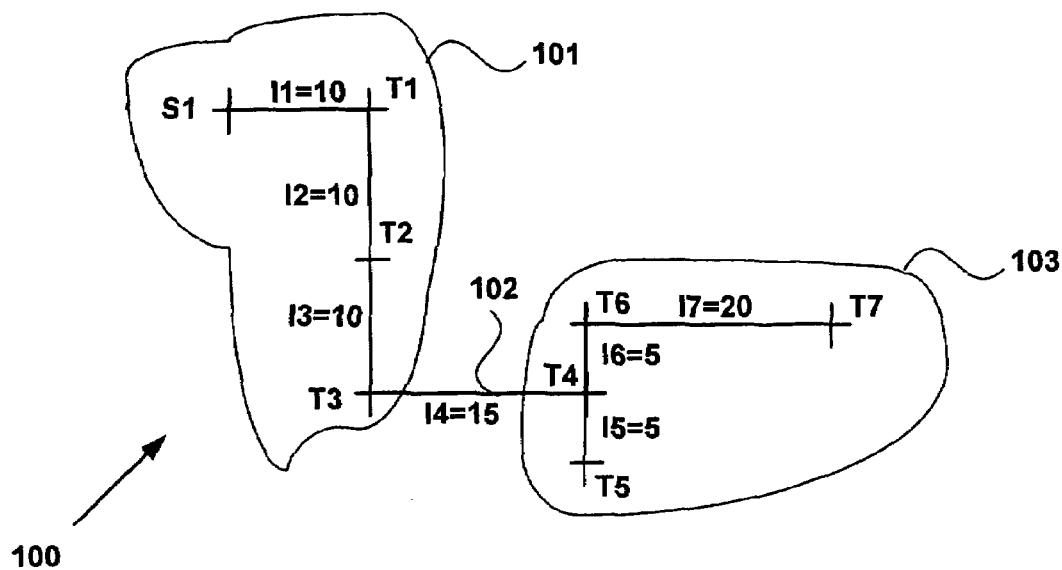
FIG. 1 shows an exemplary geometry of a wiring routing.

It will be appreciated that for the simplicity and clarity of the illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

The present invention is a method for modeling an interconnection wiring routing having geometry definable by a cluster of source point and target points, and by segments interconnecting these points.

FIG. 1 shows an exemplary geometry of a wiring routing. It should be clear to one who is practiced in the art that a given signal path may be implemented by using different geometries. Nevertheless, the method disclosed in the present invention may be successfully employed on any given geometry. Different exemplary wire model strategies are described hereinafter in respect of the exemplary wiring routing geometry for demonstrating the method of the present invention.

Figure 3:
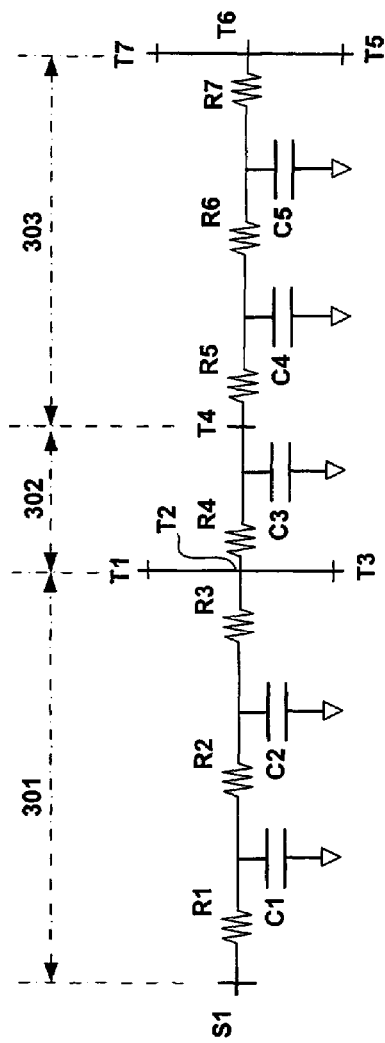
FIG. 3 exemplifies a wire model strategic according to which one segment is replaced with a WMO on individual basis whereas the other segments have been divided into two different groups of sequential and adjacent segments, or paths, according to some embodiment of the present invention.

According to some embodiments of the present invention, lengths of one or more of segments l1 to l7 may be summed up along one or more, not overlapping, paths between corresponding pairs of points. For example, segments l1 to l3 may be summed up along between points S1 and t3 (i.e., along path S1→T3), to yield $$L_{13} = \sum_{i=1}^{3} li = l1 + l2 + l3 = 10 + 10 + 10 = 30 \quad (1)$$

and a WMO may then be (electric-wise) inserted between these points (i.e., between points S1 and T3/T2) based on the path length, 30 in this case, and on a predefined set of selection rules. An exemplary WMO, which was selected for path S1→T3 is shown in FIG. 3 (301).

Likewise, segments l5 to l7 may be summed up along path T5→T7, to yield $$L_{57} = \sum_{i=5}^{7} li = l5 + l6 + l7 = 5 + 5 + 20 = 30 \qquad (2)$$

and a wire model object may be (electric-wise) inserted between point T4 and points T5/T6/T7, based on the path length, 30 in this case, and on a predefined set of selection rules. An exemplary WMO, which was selected for path T5→T7 is shown in FIG. 3 (303).

According to some further embodiments of the present invention, WMOs may be schematically inserted into the wiring routing on a 'WMO-per-segment' basis. That is, one or more segments may each be replaced by a corresponding WMO on individual basis. For example, segment l4 may be schematically replaced by WMO without factoring in any other segments in the routing geometry, as exemplified in FIG. 3 (302).

Figure 4:
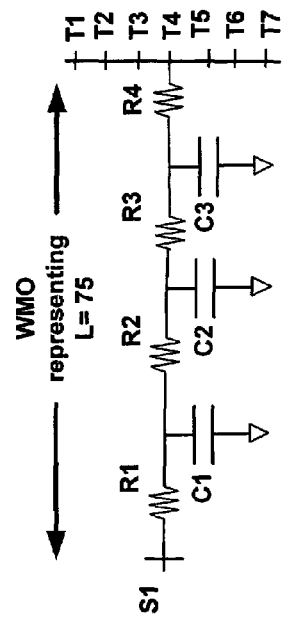
FIG. 4 exemplifies modeling the wiring routing geometry 100 of FIG. 1 using one WMO in some embodiments of the present invention.
Figure 5:
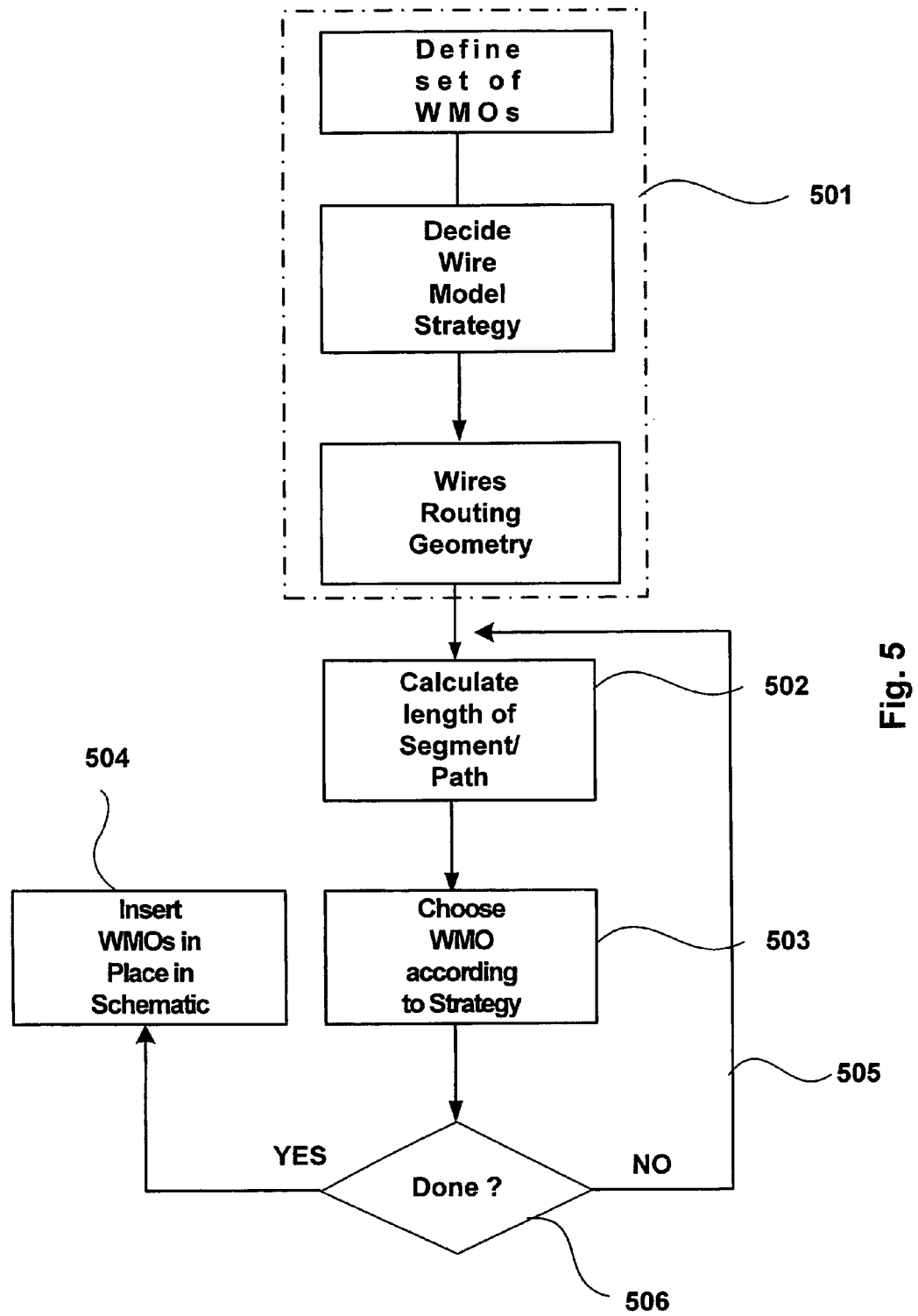
FIG. 5 is a general flow diagram executable by a computer program according to some embodiments of the present invention.

If desired, the entire wiring routing geometry 100 may be regarded and treated as one group, and a WMO may be inserted between the source point (S1) and the target points (T1 to T7, inclusive) based on the longest path, or average path, in the routing geometry. In the example shown in FIG. 1, the longest path is:

$$L_{\text{longest\_path}} = \sum_{i=1-4,6-7} li = l1 + l2 + l3 + l4 + l6 + l7 = 70 \qquad (3)$$

and the entire geometry of FIG. 1 is shown in FIG. 4 replaced with one WMO.

According to some further embodiments of the present invention, a WMO may be selected based on a predefined manipulation of the total and average lengths; i.e., the WMO may be selected according to $L_{longest\_path} \pm x$ %, or to $L_{average\_path} \pm x$ %, wherein 'x' may be some compensation factor. For example, 'x' may equal to 2%, or 3%, etc., depending on the nature of the compensation required or desired.

According to some further embodiments of the present invention, a WMO insertion rule may be selected based on any combination of several factors, such as: segment length, length of a group of segments, total path length of the entire routing geometry, spacing between adjacent segments, wires' metal and width. Other factors may be factored in.

According to some embodiments of the present invention, a WMO may be selected from a group consisting of: {"C"; one "RC" arrangement; 'n'-times "Π"-type filter arrangement, wherein n=1, 2, 3, . . . , }, as exemplified in FIGS. 2, 3 and 4, based on a predefined set of selection rules. For example, two or more length ranges may be predefined, each of which may be uniquely associated with one of the WMO types specified above. A specific WMO may be selected for a segment, or a group of sequential segments or path, which ever the case may be, based on the association. For example, a WMO may be selected for a segment, or group of sequential segments or path, of interest using the following set of selection rules, which is associated with the following four predefined length ranges:

(i) if $0 < l \leq l1$, it may be decided that no replacement will occur in respect of the segment or path involved, or, alternatively, the WMO will consist of only one capacitor;

(ii) if $l1 < l \leq l2$, it may be decided that the WMO will consist of a 'simple' "RC" arrangement; i.e., one capacitor and one resistor;

(iii) if $l2 < l \leq l3$, it may be decided that the WMO will consist of "RC" elements arranged as one basic "Π"-type filter; and (iv) if $l3 < l \leq l4$ it may be decided that the WMO will consist of "RC" elements arranged in two, or more, cascading basic "Π"-type filters.

Wherein $l1 < l2 < l3 < l4$ and 'l' is the length of the segment, or group of segments (i.e., path), or the longest path or average path or a manipulation of the longest path or average path (e.g., $l = L_{longest\_path} * 0.80$).

It is noted that the terms '$L_{longest\_path}$' and '$L_{average\_path}$' (including their manipulations, as the case may be), may be used in respect of individual segments and also in respect of longer paths (i.e., group(s) of sequential segments), wherever applicable, as well as in respect of the entire routing geometry. For example, in respect of the group of sequential segments l1, l2, l3 (i.e., path S1→T3, FIG. 1), l may equal to $L_{longest\_path} = 30$, or it may be manipulated to equal: $l = L_{longest\_path} * 0.80 = 30 * 0.8 = 24.0$.

Using exemplary values for l1, l2, l3 and l4:10 micrometer ("μm"), 25 μm, 50 μm and 80 μm, respectively, and the exemplary length $l = L_{longest\_path} * 0.80 = 24.0$ μm, and given the set of selection rules specified hereinbefore, the WMO to be selected for the given path (i.e., S1→T3, FIG. 1) will consist of a 'simple' "RC" arrangement, i.e., one capacitor and one resistor, because the condition $l1 < l \leq l2$ is met, for this example (i.e., 10<24.0<25).

Figure 2:
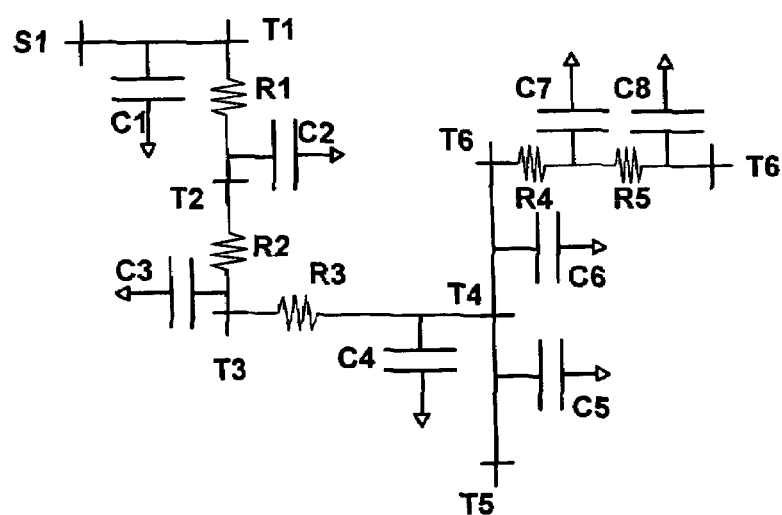
FIG. 2 exemplifies a wire model strategic according to which every segment in the wiring routing geometry 100 of FIG. 1 is modeled according to some embodiments of the present invention.

FIG. 2 exemplifies a wire model strategic according to which every segment in the wiring routing geometry 100 of FIG. 1 is modeled according to some embodiments of the present invention. It may be decided that each one of the segments of geometry 100 (FIG. 1) will be replaced with WMO. For example, segment l1=10 of FIG. 1 is shown in FIG. 2 replaced with the simplest WMO; i.e., one capacitor element, C1, for being relatively short in length (i.e., 10). In another example, segment l7=20 of FIG. 1 is shown in FIG. 2 replaced with the most complicated WMO ('most complicated'—in FIG. 2); i.e., two capacitor elements, C7 and C8, and three resistor elements, R4, R5 and R6, for being relatively long in length (i.e., 20).

As is shown in FIG. 2, each WMO is inserted between the corresponding points (S1 and T1 to T7), in the schematic sense, to maintain the functional integrity, or continuity, of the wiring geometry.

FIG. 3 exemplifies a wire model strategy according to which one segment is replaced with a WMO on individual basis (i.e., segment l4, FIG. 1, modeled as equivalent WMO 302, between T1/T2/T3 and T4, FIG. 3), whereas the other segments have been divided into two different groups of sequential and adjacent segments, or paths. Namely, segments l1, l2 and l3 form a first group, or first path, that is modeled as equivalent WMO 301, between S1 and T1/T2/T3, and segments l5, l6 and l7 form a second group, or second path, that is modeled as equivalent WMO 303, between T4 and T5/T6/T7. Because the two paths have the same total length (i.e., l1+l2+l3=l5+l6+l7(=30)), WMOs 301 and 303 are essentially identical. That is WMOs 301 and 303 each consists of two capacitor elements and three resistor element arranged in the same way.

FIG. 4 exemplifies the modeling of wiring routing geometry 100 of FIG. 1 using one WMO. A corresponding WMO may be selected for replacing the entire routing geometry 100 by factoring in the length of all, or almost all, the geometry's segments, and selecting the WMO based on the resulting path length, or a manipulation thereof as described hereinbefore, and set of selection rules specified above. For example, it may be decided that the WMO will be selected based on the longest path in the geometry, $L_{longest\_path}=70$ (see equation (3) above). Then, it may be decided that for a path as long as 70, the WMO will consist "R" and "C" elements arranged as shown in FIG. 4.

It is noted that points T1 to T7 are shown connected to one another without using any WMO in-between, because the overall parasitic effect of the entire wiring routing geometry (100, FIG. 1) is embodied in one WMO. The WMO may then be inserted, in the electrical sense, between source point S1 and the target points T1 to T7. An exemplary WMO may consist of three capacitor elements, C1 to C3, and four resistor elements, R1 to R4, arranged as shown in FIG. 4.

It is noted that the modeling strategy that is exemplified in FIG. 4 reflects the time-wise worst case (i.e., in terms of time analysis) because each one of the target points T1 to T6 is assumed to be as far (i.e., from the source point S1) as the farthest target point (i.e., T7). In other words, points T1 to T6 are treated as if they are farther from S1 than they really are.

According to the present invention, a computer program product is also provided, which comprises a computer useable medium that includes a computer readable program. The computer readable program, when executed on a computer, may cause the computer to accept data relating to a set of WMOs, predefined wire model strategy for selecting thereby proper WMOs, and wire routing geometry (501). The geometry may be defined by source points and target points, and segments that are interconnecting the points. The computer readable program may cause the computer to calculate segments', and/or path(s), length (502) associated with the wire routing geometry. The computer readable program may then cause the computer to select a WMO, for each segment and path, based on the strategy (503), and to seamlessly insert the various WMOs between the corresponding points (504), so as to maintain the electrical continuity of the wire routing as a whole. The computer program may cause the computer to repeat the modeling phase (505) until each segment and path is modeled (506).

Figure 6:
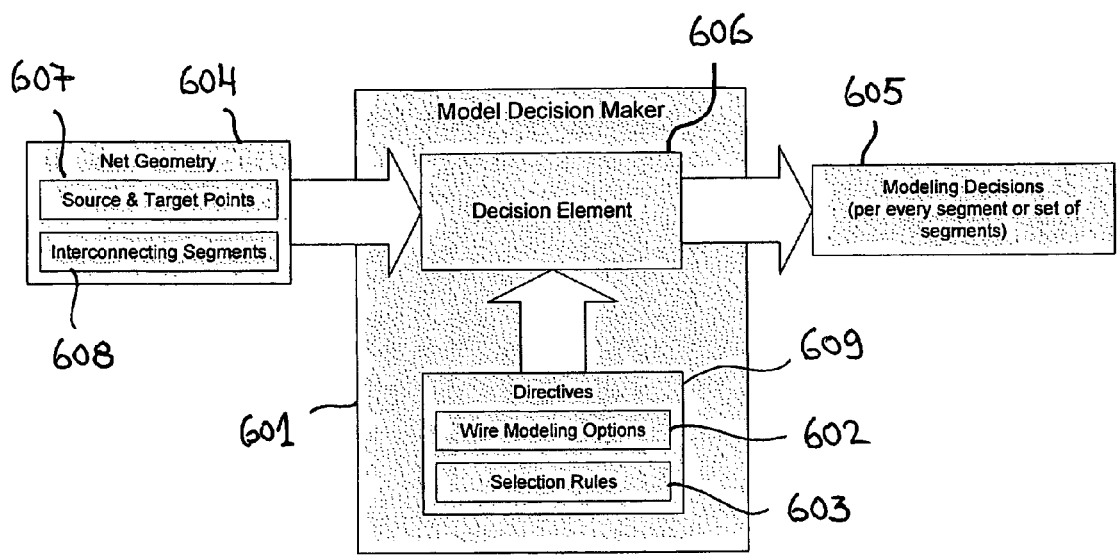
FIG. 6 schematically illustrates the general layout and functionality of the system according to some embodiments of the present invention.

Referring to FIG. 6, it schematically illustrates the general layout and functionality of the system according to some embodiments of the present invention. The system may comprise an input memory 604 for storing therein, inter alia, data relating to a physical geometry of wiring routing of a signal path in an electric circuit. The network geometry may be defined by a cluster consisting of one or more source and target points (607), and by line segments that interconnect the points (608).

According to some embodiments of the present invention, the system may further comprise a model decision maker ("MDM") 601 for deciding one or more WMOs each segment should be substituted with. The MDM may comprise a decision element and a storage array 609 for storing therein WMOs (602) and a set of selection rules (603) that depends on a preferred wire model strategy. The decision element 606 may model the wiring routing stored in memory 604 in whole or in part, by replacing, in the schematic sense, one segment or a group of sequential segments, with WMOs, or by replacing the entire wire routing geometry with one WMO. The decision element 606 may replace the entire routing geometry or segment(s) thereof based on the wire model options (602) and selection rules (603) available.

The system may further comprise an output memory 605 for storing therein data relating to the modeling decisions made by the decision element 606.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A method for modeling an interconnection wiring routing having a known geometry, the method comprising defining a wire model strategy and automatically replacing said wiring routing geometry in a circuit schematic with one or more wire model objects based on said wire model strategy, wherein said wiring routing geometry is defined by a cluster consisting of one or more source points and one or more target points and by segments interconnecting said points in a known path, and wherein the wire model strategy comprises selecting one or more wire model objects based on a predefined set of selection rules, and replacing one or more of said segments and/or paths with said one or more selected wire model objects, wherein the wire model strategy comprises inserting the selected wire model objects into the wiring routing geometry per groups of sequential of said segments, wherein further comprising summing the length of said sequential segments along one or more, not overlapping, of said paths between corresponding pairs of said source and target points, and, for each of said pairs of points, inserting therebetween a selected wire model object.

2. The method according to claim 1, wherein selecting one or more wire model objects comprise selecting a wire model object from a group consisting of: a capacitor (C); one resistor-capacitor (RC) arrangement; a plurality (n) of Π-type filters arrangement, wherein n=1, 2, 3 . . . , based on the predefined set of selection rules.

3. The method according to claim 1, wherein the predefined set of selection rules comprises associating a segment or path length to one of a plurality of predefined length ranges, wherein the predefined set of selection rules comprises selecting a segment or path length based on a length 'l' that is selectable from the group of lengths consisting of: $\{l=L_{longest\_path}; l=L_{longest\_path\pm x\ \%}; l=L_{average\_path}; l=L_{average\_path}\pm x\ \%\}$.

4. The method according to claim 3, wherein the predefined set of selection rules further comprises factoring in spacing between adjacent segments, wire metal type, and wire width.

5. A computer program product which comprises a computer useable medium that includes a computer readable program, said computer readable program, when executed on a computer, causes said computer to model an interconnection wiring routing having a known geometry by defining a wire model strategy and automatically replacing said wiring routing geometry in a circuit schematic with one or more wire model objects based on said wire model strategy, wherein said wiring routing geometry is defined by a cluster consisting of one or more source points and one or more target points and by segments interconnecting said points in a known path, and the wire model strategy includes selecting one or more wire model objects based on a predefined set of selection rules, and replacing one or more of said segments and/or paths with said one or more of the selected wire model objects, wherein the wire model strategy includes insertion of the selected wire model objects into the wiring routing geometry per groups of sequential of said segments, wherein the wire model strategy further includes summing the length of said sequential segments along one or more, not overlapping, of said paths between corresponding pairs of said source and target points, and, for each of said pairs of points, inserting therebetween a selected wire model object.

6. A system for modeling an interconnection wiring routing having a known geometry, comprising:
  a) an input memory for storing therein data relating to a wiring routing geometry of a signal path in an electric circuit design, said wiring routing geometry defined by a cluster consisting of one or more source points and one or more target points, and by line segments that interconnect said points;
  b) a model decision maker for deciding one or more wire model objects to replace said segments, said model decision maker comprising:
    i. a decision element, and:
    ii. a storage array for storing therein said wire model objects and a set of selection rules that depends on a preferred wire model strategy;

wherein said decision element is to model the wiring routing geometry stored in said input memory in whole or in part, by automatically replacing, in the-circuit schematic, one or more of said segments with one or more of said wire model objects, based on the wire model strategy and the selection rules, wherein the wire model strategy includes insertion of wire model objects into the wiring routing geometry per groups of sequential of said segments
  wherein the wire model strategy further includes summing lengths of sequential of said segments along one or more, not overlapping, of said signal paths between corresponding pairs of said source and target points, and, for each of said pairs of points, inserting there between a wire model object of said wire model objects.

* * * * *